United States Patent [19]

Miura

[11] Patent Number: 5,233,218
[45] Date of Patent: Aug. 3, 1993

[54] SEMICONDUCTOR WAFER AND PROCESS FOR PRODUCING SAME

[75] Inventor: Takao Miura, Kawasaki, Japan

[73] Assignee: Fujitsu Limited, Kanagawa, Japan

[21] Appl. No.: 762,115

[22] Filed: Sep. 19, 1991

[30] Foreign Application Priority Data

Sep. 20, 1990 [JP] Japan .................................. 2-248946

[51] Int. Cl.⁵ ..................... H01L 27/12; H01L 27/01; H01L 29/34
[52] U.S. Cl. ................................. 257/618; 257/629; 257/347; 257/787
[58] Field of Search ...................... 357/4, 23.7, 91, 52; 437/225; 257/618, 629, 347, 787

[56] References Cited

FOREIGN PATENT DOCUMENTS 59-104139  6/1984  Japan .
61-59738   3/1986  Japan .
62-172728  7/1987  Japan .

Primary Examiner—Mark V. Prenty
Attorney, Agent, or Firm—Armstrong, Westerman, Hattori, McLeland & Naughton

[57] ABSTRACT

A silicon-on-insulator type semiconductor wafer comprising: an upper silicon semiconductor layer used for forming electronic elements thereon; a lower silicon semiconductor layer acting as a support for the entire wafer; an intermediate silicon oxide layer inserted between the upper and lower portions and acting as an insulating layer, and a circumferential portion for protecting the silicon oxide layer, at least at the periphery thereof, against an agent for dissolving silicon oxide.

5 Claims, 6 Drawing Sheets

SEMICONDUCTOR WAFER AND PROCESS FOR PRODUCING SAME

BACKGROUND OF THE INVENTION

1. Field of the Invention

The present invention relates to a semiconductor wafer, more specifically to a silicon-on-insulator type silicon semiconductor wafer or SOI wafer having an insulating layer inserted between an upper and a lower silicon semiconductor portions thereof, and a process for producing the same.

2. Description of the Related Art

An SOI wafer has a structure in which an insulating layer is inserted between an upper wafer portion of single crystalline silicon for forming electronic elements thereon (hereinafter referred to as "element wafer portion") and a lower wafer portion of single crystalline silicon acting as a support for the entire wafer (hereinafter referred to as "support wafer portion").

A conventional SOI wafer has a structure as shown in FIG. 1A, in which an insulating layer 13 is simply inserted between upper and lower silicon semiconductor portions 11 and 12 of a wafer 10' to form a "sandwich" structure, the insulating layer 13 being exposed at the periphery of the wafer 10'.

The insulating layer 13 is preferably formed of silicon oxide for ensuring good interface characteristics between the insulating layer 13 and the overlying element wafer portion 11 formed of silicon.

Nevertheless, the production of semiconductor devices includes etching of various silicon oxide films, during which the silicon oxide layer 13 of an SOI structure is also etched in the circumferential portion 14 of the wafer 10' to cause the silicon oxide layer 13 to regress from the circumference 14 of the wafer 10', and thereby, the element wafer portion 11 relatively protrudes to form eaves 17, as shown in FIG. 1B. The element wafer portion 11 usually is as thin as about 1 to 5 microns and has a mechanical strength so poor that the protruded eaves 17 are easily broken or worn off during various treatments and handling of the wafer 10'. The broken or worn off silicon particles stick to the wafer surface as dust, which causes a pattern defect or a defect of deposited layers and leads to poor product yield.

SUMMARY OF THE INVENTION

An object of the present invention is to provide an SOI wafer having an improved structure for preventing an undesired etching of a silicon oxide layer acting as the insulating layer of an SOI structure.

Another object of the present invention is to provide a process for producing an SOI wafer having such an improved structure.

To achieve the above object according to the present invention, there is provided a silicon-on-insulator type semiconductor wafer comprising:

an upper semiconductor portion of single crystalline silicon used for forming electronic elements thereon:

a lower semiconductor portion of single crystalline silicon acting as a support for the entire wafer; and an intermediate silicon oxide portion inserted between said upper and lower portions and acting as an insulating layer; and a circumferential portion for protecting said silicon oxide layer, at least at the periphery thereof, against an agent for dissolving silicon oxide.

The agent for dissolving silicon oxide includes enchants used for silicon oxide films in the production of semiconductor devices, such as an aqueous solution of fluoric acid, ammonia, and potassium hydroxide. Fluoric acid is generally used for this purpose because it has the highest etching rate. In this case, the silicon oxide layer of an SOI wafer must be protected with a fluoric acid resistance coating or covering, at least at the periphery of the wafer. A fluoric acid resistance coating need not be specifically limited and may be any coating having a protecting function against fluoric acid, although a coating of Si or $Si_3N_4$ is most preferred. Other coatings such as SiC and SiGe may also be used for this purpose. The protective coating may be composed either of a single layer of single substance or of a lamination of a plurality of layers of different substances.

An SOI wafer according to the present invention may be produced either by a SIMOX (Separation by Implanted Oxygen) process, in which oxygen ions are implanted into a silicon semiconductor wafer, or by a lamination process, in which two silicon wafers are laminated, one having a silicon oxide layer thereon and the other not having said layer (all-silicon wafer).

According to one aspect of the present invention, there is provided a process for producing a silicon-on-insulator type semiconductor wafer, said process comprising:

forming a silicon oxide layer between upper and lower layers of a silicon semiconductor wafer by implanting oxygen ions into said silicon wafer, while masking the circumferential portion of said silicon wafer so that oxygen ions are not implanted into the circumferential portion.

According to another aspect of the present invention, there is provided a process for producing a silicon-on-insulator type semiconductor wafer, said process comprising:

removing the circumferential portion of a silicon-on-insulator type semiconductor wafer produced by a lamination method;

covering a silicon oxide layer lying between upper and lower portions of said wafer at the periphery thereof with a protective substance against an agent for dissolving silicon oxide; and removing unnecessary portions of said protective covering.

An SOI wafer according to the present invention has a circumferential portion for protecting the silicon oxide layer of the SOI structure, at least at the periphery thereof, against an agent for dissolving silicon oxide, and therefore, the silicon oxide layer of SOI structure is not etched in the peripheral portion thereof during etching treatments of silicon oxide films in the production of semiconductor devices. Namely, an element wafer portion does not protrude in the peripheral portion, forming eaves, and thereby, a dust of silicon particles is not generated during various treatments and handling of the wafer.

According to the present inventive process using a SIMOX process, oxygen ions are not implanted in the peripheral portion of a wafer, and therefore, a silicon oxide layer is only formed inside the wafer, i.e., the silicon oxide layer is not exposed at the wafer periphery, with the result that the silicon oxide layer of an SOI structure is protected by the wafer silicon against an agent for dissolving silicon oxide.

An SOI wafer produced by a lamination process has a non-bonded portion in the periphery thereof in the laminated or bonded state, and in general, the non-bonded peripheral portion must be removed. This removal exposes the silicon oxide layer composing the insulating layer of an SOI wafer, in the periphery of the wafer. Therefore, the exposed silicon oxide layer must be coated or covered with a protective substance, at least in the wafer periphery, against an agent for dissolving silicon oxide. Any unnecessary portion of the protective coating is then removed. Thus, the silicon oxide layer is protected by the protective coating in the wafer periphery, so that various etching treatments of silicon oxide films do not cause the element wafer portion to form eaves.

DESCRIPTION OF THE PREFERRED EMBODIMENTS

The present invention will be described in further detail by way of examples.

EXAMPLE 1

Referring to FIGS. 2A to 2D, SOI wafers produced by a SIMOX process according to the present invention will be described.

Figure 1A:
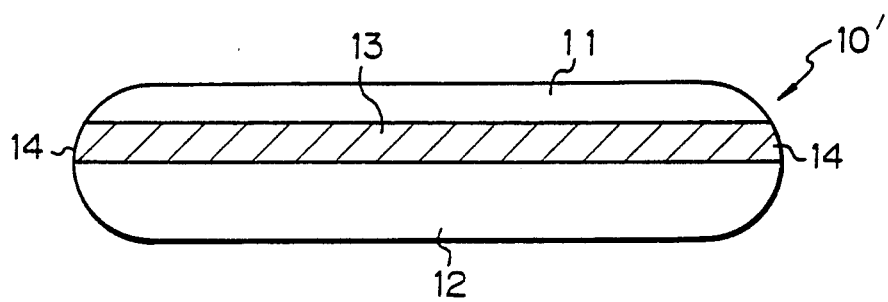
FIGS. 1A and 1B show a conventional SOI wafer (A) before and (B) after an etching treatment of silicon oxide films, in sectional view.
Figure 1B:
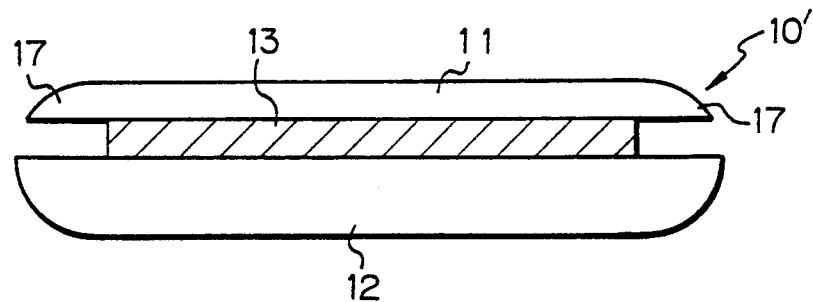
Figure 2A:
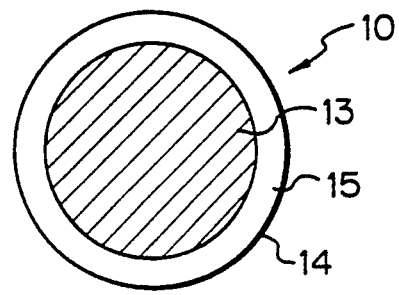
FIGS. 2A and 2B show an SOI wafer produced by a SIMOX process and FIGS. 2C and 2D show a silicon wafer in sectional view being implanted with oxygen ions, according to the present invention.
Figure 2B:
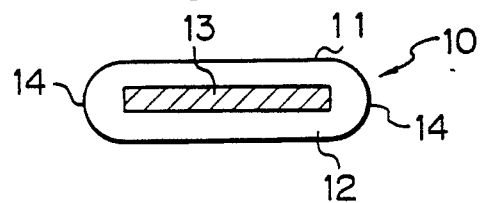

FIGS. 2A and 2B show a SIMOX-SOI wafer, FIG. 2A shows a section along a mid-thickness plane through a silicon oxide layer and FIG. 2B shows a section along a plane including the wafer diameter. The silicon oxide layer 13 is not present in the periphery 15 of an SOI wafer 10, and thereby is covered and protected by the wafer circumferential portion 14.

Figure 2C:
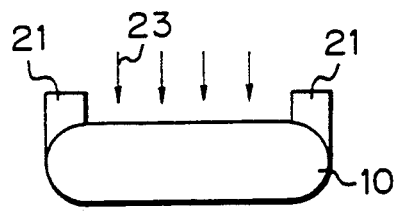
Figure 2D:
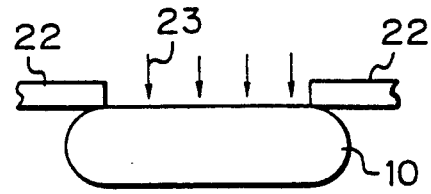

This structure is formed by implanting oxygen ions into a silicon wafer, using a resist mask 21, as shown in FIG. 2C, or an aperture mask 22, as shown in FIG. 2D, for example, for shielding the wafer circumference 15 from an oxygen ion beam 23.

EXAMPLE 2

Referring to FIGS. 3A to 3M, SOI wafers produced by a lamination process according to the present invention will be described.

Figure 3A:
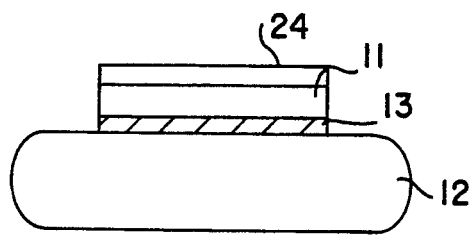
FIGS. 3A through 3M(d) show various sequences in sectional view for producing an SOI wafer by a lamination process, according to the present invention.

Sample A (FIG. 3A)

Step (a)

An shown in FIG. 3A(a), an SOI silicon semiconductor wafer is produced by a lamination process by using a support wafer 12 having a silicon oxide layer 13 on one side only. An element wafer portion 11 and the oxide layer 13 are patterned by using a photoresist 24 to form a step of the silicon oxide layer 13 and the overlying element wafer portion 11 on the support wafer portion 12.

Step (b)

After removing the resist 24, an epitaxial silicon film 101 is formed by a vapor phase epitaxy to cover the upper and circumferential surfaces of the wafer, as shown in FIG. 3A(b).

Step (c)

The convexed portion of the epitaxial silicon 101 formed on the step is removed by grinding to expose the upper surface of the element wafer portion 11 to obtain an SOI wafer 10 of the present invention, in which the silicon oxide layer 13 is entirely covered and protected by the wafer silicon and the eptiaxial silicon, as shown in FIG. 3A(c).

Figure 3B:
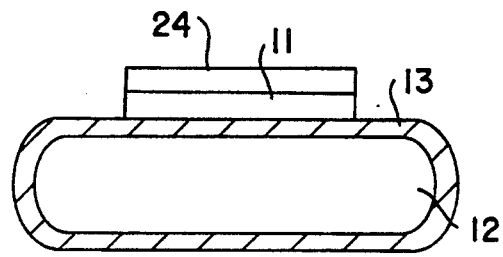
Figure 3A:
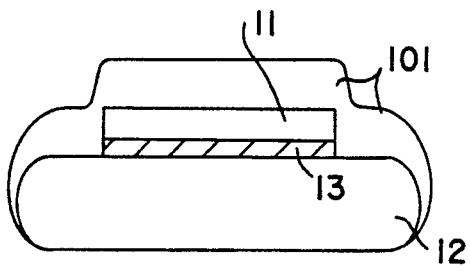
Figure 3B:
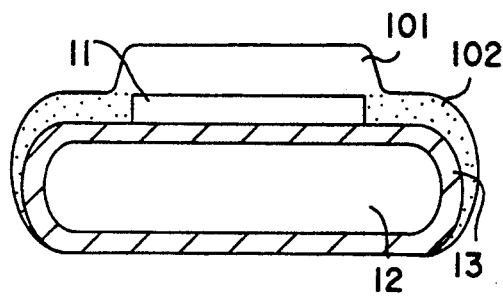
Figure 3A:
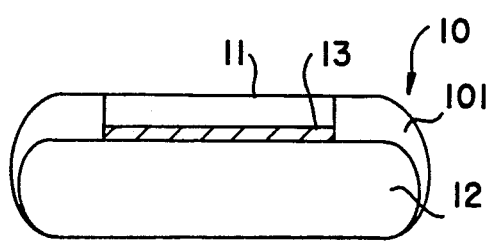
Figure 3B:
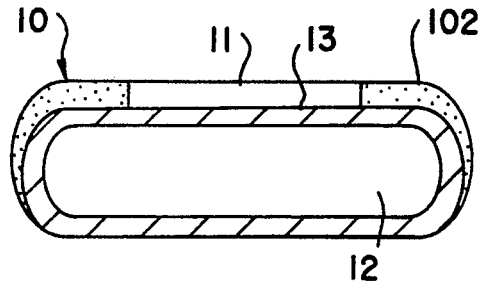

Sample B (FIG. 3B)

Step (a)

As shown in FIG. 3B(a), an SOI silicon semiconductor wafer is produced by a lamination process by using a support wafer 12 having a silicon oxide layer 13 over the entire wafer surface. An element wafer portion 11 is patterned by using a photoresist 24 to form a step of the element wafer portion 11 on the silicon oxide layer 13 of the support wafer portion 12.

Step (b)

After removing the resist 24, a growth process of a silicon film is performed by a vapor phase epitaxy to form an epitaxial silicon film 101 on the element wafer portion 11 and a polycrystalline silicon film 102 on the exposed portion of the silicon oxide layer 13, so that the epitaxial and the polycrystalline silicon films 101 and 102 cover the upper and the circumferential surfaces of the wafer.

Step (c)

The convexed portion of the epitaxial silicon 101 formed on the step is removed by grinding to expose the upper surface of the element wafer portion 11 to obtain an SOI wafer 10 of the present invention, in which the silicon oxide layer 13 is covered by the wafer silicon and the polysilicon 102, except for the wafer bottom, and thereby protected particularly in the peripheral portion thereof.

Figure 3C:
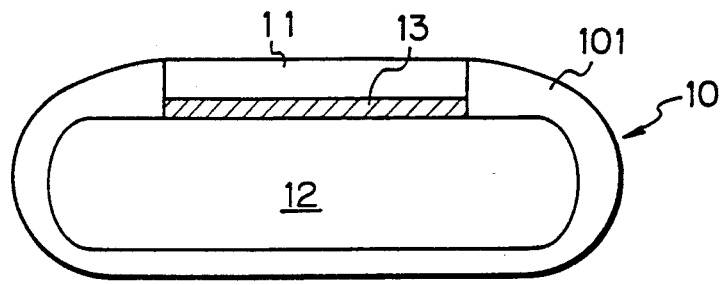

Sample C (FIG. 3C)

In a modification of the step (b) of Sample A, an epitaxial silicon film 101 is formed to cover the entire surface of the wafer, including the wafer bottom, followed by the same step (c) of Sample A, to cover the entire wafer surface with the epitaxial silicon film 101, except for the upper surface of the element wafer portion 11.

Figure 3D:
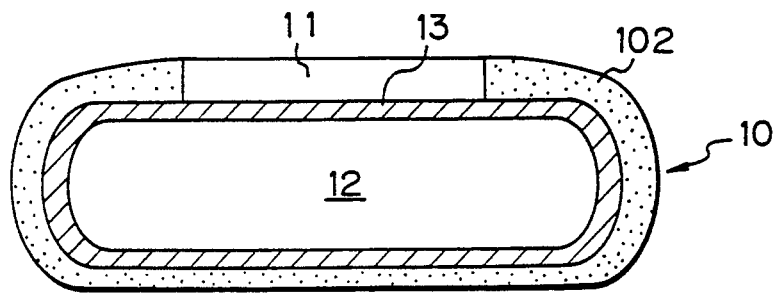

Sample D (FIG. 3D)

In a modification of the step (b) of Sample B, a polysilicon film 102 formed to cover the entire surface of the wafer, including the wafer bottom, followed by the same step (c) of Sample B, to cover the entire wafer surface with the polysilicon film 101, except for the upper surface of the element wafer portion 11.

Figure 3E:
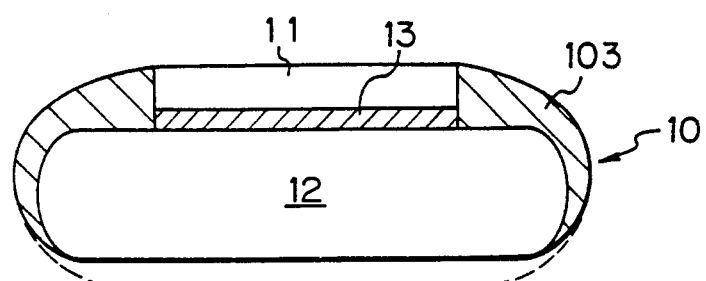

Sample E (FIG. 3E)

In a modification of Sample A or C, an $Si_3N_4$ film 103 is used instead of the polysilicon film 101. This $Si_3N_4$ film 103 may also cover the wafer bottom as shown by the broken line, such as effected in Sample C.

Figure 3F:
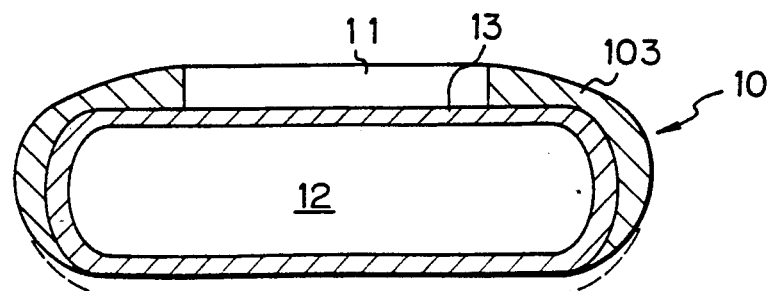

Sample F (FIG. 3F)

In a modification of Sample B or D, an $Si_3N_4$ film 103 is used instead of the polysilicon film 102. This $Si_3N_4$ film 103 may also cover the wafer bottom as shown by the broken line, such as effected in Sample D.

Figure 3G:
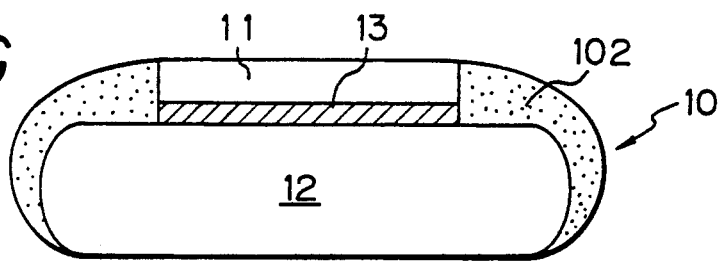

Sample G (FIG. 3G)

In another modification of Sample A or C, a polysilicon film 102 is used instead of the epitaxial silicon film 101. This polysilicon film 102 may also cover the wafer bottom as shown by the broken line, such as effected in Sample C.

Figure 3H:
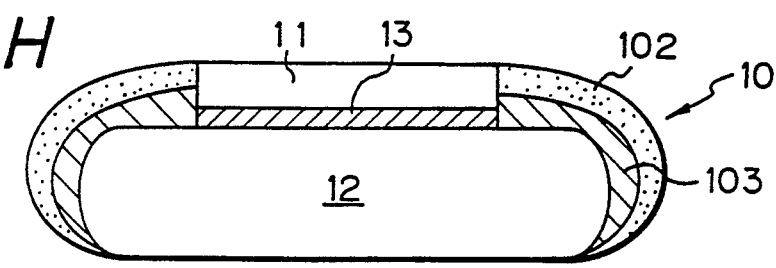

Sample H (FIG. 3H)

In another modification of Sample A, C, E, or G, a protective coating has a double-layered structure composed of an $Si_3N_4$ film 103 and a polysilicon film 102.

Figure 3I:
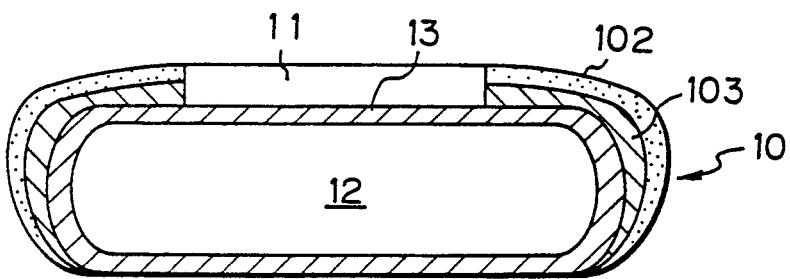

Sample I (FIG. 3I)

In a modification of Sample B, D, or F, a protective coating has a double-layered structure composed of an $Si_3N_4$ film 103 and a polysilicon film 102.

Figure 3J:
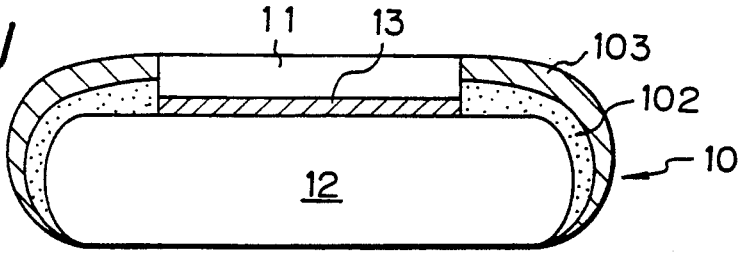

Sample J (FIG. 3J)

In a modification of Sample H, a protective coating has a double-layered structure composed of an inner layer of a polysilicon film 102 and an outer layer of an $Si_3N_4$ film 103, i.e., these two layers are arranged in reversed order with respect to Sample H.

Figure 3K:
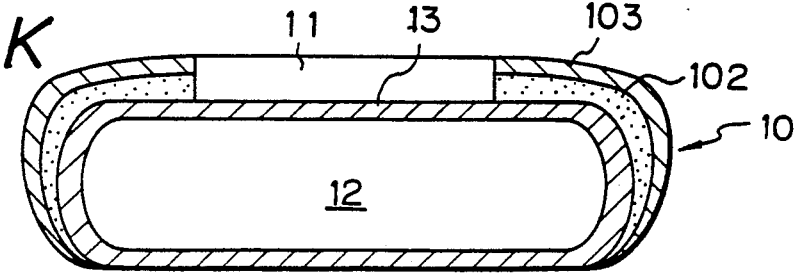

Sample K (FIG. 3K)

In a modification of Sample I, a protective coating has a double-layered structure composed of an inner layer of a polysilicon film 102 and an outer layer of an $Si_3N_4$ film 103, i.e., these two layers are arranged in reversed order with respect to Sample I.

In the above-described Samples A to K, an element wafer portion 11 or an element wafer portion 11 and a silicon oxide layer 13 are formed in the shape of a step, but may not be formed in said step shape, as in the following Samples.

Figure 3L:
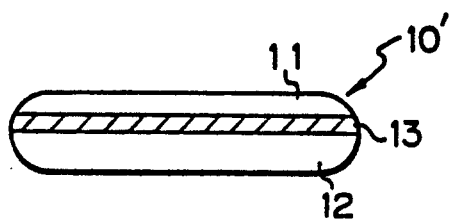
Figure 3L:
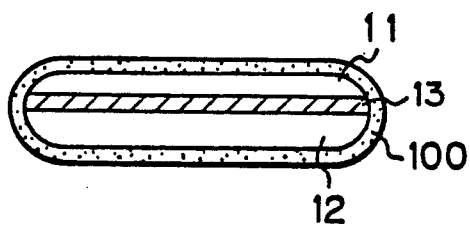
Figure 3L:
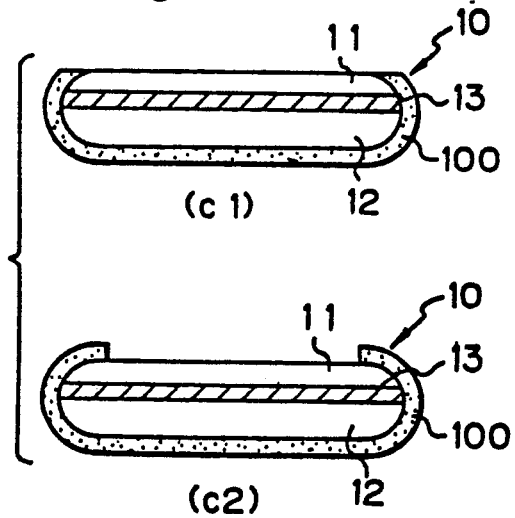

Sample L (FIG. 3L)

Step (a)

An SOI silicon semiconductor wafer 10' produced by a lamination process is chamfered in the circumferential portion thereof.

Step (b)

The wafer 10' is entirely covered with a protective coating 100 by a chemical vapor deposition. The protective coating 100 may be composed of a single layer or a double-layered structure as used in the preceding Samples.

Step (c)

The protective coating 100 is removed from the element wafer side by grinding as shown in FIG. 3L(c1) or by patterning as shown in FIG. 3L(c2), to expose the upper surface of the element wafer portion 11, and thereby, complete an SOI wafer 10 of the present invention.

Figure 3M:
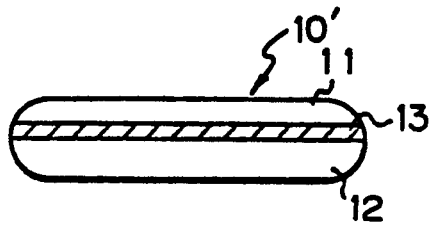
Figure 3M:
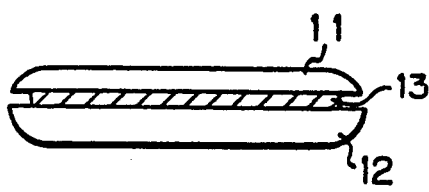
Figure 3M:
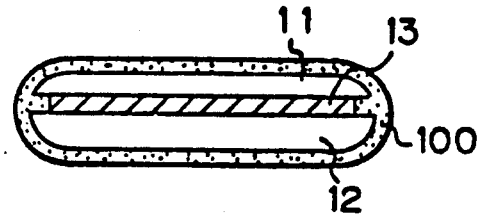
Figure 3M:
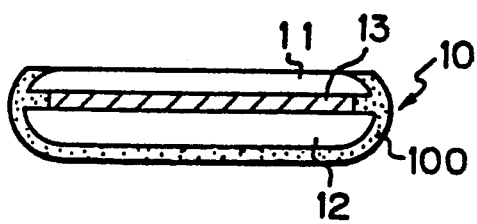

Sample M (FIG. 3M)

Step (a)

An SOI silicon semiconductor wafer 10' produced by a lamination process is chamfered in the circumferential portion thereof.

Step (b)

A silicon oxide layer 13 is etched to regress from the wafer periphery. The regression is limited to an extent such that the resultant eaves or protrusions of an element wafer portion 11 are not broken or worn off.

Step (c)

The wafer 10' is entirely covered with a protective coating 100 by a chemical vapor deposition. The protective coating 100 may be composed of a single layer or a double-layered structure as used in the preceding Samples.

Step (d)

The protective coating 100 is removed from the element wafer side by machining or patterning, to expose the upper surface of the element wafer portion 11, and thereby, complete an SOI wafer 10 of the present invention.

The present invention should not be limited to the above described Examples, but many changes and modifications are possible.

According to the present invention, the silicon oxide layer of an SOI wafer is protected in the wafer periphery against an agent for dissolving silicon oxide so that the eaves or protrusions of the element wafer portion are not formed during etching of various silicon oxide films in the production of semiconductor devices to prevent generation of silicon dust due to breakage or wearing of the eaves or protrusions, and prevent occurrence of the resultant defective patterns and defects of the various deposit films to thereby ensure a high product yield.

I claim:

1. A silicon-on-insulator type semiconductor wafer comprising:
   an upper semiconductor layer of single crystalline silicon used for forming electronic elements thereon;
   a lower semiconductor layer of single crystalline silicon acting as a support for the entire wafer;
   an intermediate silicon oxide layer inserted between said upper and lower layers and acting as an insulating layer; and
   a circumferential layer having a smooth curved surface of protecting said intermediate silicon oxide layer at the periphery thereof against an agent for dissolving silicon oxide, wherein provision of the circumferential layer and the upper semiconductor layer prevents said intermediate silicon oxide layer from being exposed.

2. A semiconductor wafer according to claim 1, wherein said silicon-on-insulator wafer is produced by a lamination method, in which an all-silicon wafer is laminated on a silicon wafer having a silicon oxide layer formed thereon.

3. A semiconductor wafer according to claim 1, wherein said silicon-on-insulator type wafer is produced by a separation-by-implanted-oxygen (SIMOX) method, in which oxygen ions are implanted into a silicon wafer to form an insulating layer of silicon oxide.

4. A semiconductor wafer according to claim 1, wherein said circumferential layer is composed of a fluoric acid-resisting substance.

5. A semiconductor wafer according to claim 4, wherein said circumferential layer is composed of one or more layers of at least one selected from the group consisting of Si, $Si_3N_4$, SiC, and SiGe.

* * * * *